United States Patent
Bul et al.

(10) Patent No.: US 6,812,525 B2
(45) Date of Patent: Nov. 2, 2004

(54) TRENCH FILL PROCESS

(75) Inventors: Igor Bul, Sherman Oaks, CA (US);
Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/465,496

(22) Filed: Jun. 18, 2003

(65) Prior Publication Data

US 2003/0234423 A1 Dec. 25, 2003

Related U.S. Application Data

(60) Provisional application No. 60/391,794, filed on Jun. 25, 2002.

(51) Int. Cl.[7] ............................................. H01L 29/76
(52) U.S. Cl. ........................ 257/341; 257/510; 257/513; 257/520
(58) Field of Search ............................. 257/510, 513, 257/520, 341; 438/422

(56) References Cited

U.S. PATENT DOCUMENTS

| | | | | |
|---|---|---|---|---|
| 4,169,000 A | * | 9/1979 | Riseman | 438/422 |
| 5,324,683 A | * | 6/1994 | Fitch et al. | 438/422 |
| 5,508,234 A | * | 4/1996 | Dusablon et al. | 216/2 |
| 6,376,893 B1 | * | 4/2002 | Rha | 257/522 |
| 6,531,376 B1 | * | 3/2003 | Cai et al. | 438/422 |
| 6,608,350 B2 | * | 8/2003 | Kinzer et al. | 257/341 |
| 2003/0234423 A1 | * | 12/2003 | Bul et al. | 257/341 |

* cited by examiner

Primary Examiner—Mark V. Prenty
(74) Attorney, Agent, or Firm—Ostrolenk, Faber, Gerb & Soffen, LLP

(57) ABSTRACT

A process for insulating the interior of the trenches of trench type MOSgated devices in which a capping oxide is formed over the top of the trenches to span approximately a 3 micron gap and then reflowing the oxide at 1050° C. in pure $O_2$ to flush air out of the trenches and leaving an at least partially evacuated sealed volume in each of the trenches.

16 Claims, 2 Drawing Sheets

TRENCH FILL PROCESS

RELATED APPLICATIONS

This application claims the benefit of U.S. Provisional Application No. 60/391,794, filed Jun. 25, 2002.

FIELD OF THE INVENTION

This invention relates to the processing of semiconductor devices and more specifically relates to the formation of trench type superjunction semiconductor devices.

BACKGROUND OF THE INVENTION

Superjunction semiconductor devices are known in which a plurality of spaced narrow deep trenches are formed in the surface of a silicon substrate. Dielectric filled trenches may also be needed for other semiconductor devices. These trenches are filled with a dielectric medium. The filling process is complicated because the trenches are very narrow and very deep, for example, 3 to 5 microns wide and 40 to 50 microns deep.

A multistep process has been used employing the deposition of a dielectric, such as an oxide, followed by an etch back process. This was needed due to the dielectric layer non-conformity, i.e., the ratio of the dielectric thickness on the horizontal surface of the substrate to the dielectric thickness on a vertical surface is greater than one. As a result, a gap is formed inside the trench, and to fill the gap completely, the top of the dielectric is etched back, removing all dielectric from the horizontal surface, leaving only the dielectric on the vertical trench surface. This process is then repeated until the gap is completely filled.

It would be desirable to form a dielectric filled trench with a less complex and less costly process.

A further problem with the prior art process is that the dielectric material filling the trench has a temperature coefficient of expansion which differs from that of the monocrystalline silicon in which the trench is formed. Thus, a mechanical stress is applied to the silicon as it is heated during processing and in operation.

It would be desirable to eliminate the stress on the silicon due to differential temperature expansion of a filler and a trench.

BRIEF SUMMARY OF THE INVENTION

In accordance with the invention, a dielectric cap is formed over the top of a narrow, deep trench in silicon to seal the interior volume of the trench, leaving a vacuum or a low pressure high dielectric gas, for example, air, sealed within the trench.

Thus, a dielectric such as a low temperature oxide (LTO) or a PECVD oxide is deposited on the surface of a substrate containing one or more trenches to form a "bridge" over the top of each trench. The interior of the trench is fully or partly evacuated during this process and the vacuum or residual gas acts as the desired dielectric.

DETAILED DESCRIPTION OF THE DRAWINGS

Figure 1:
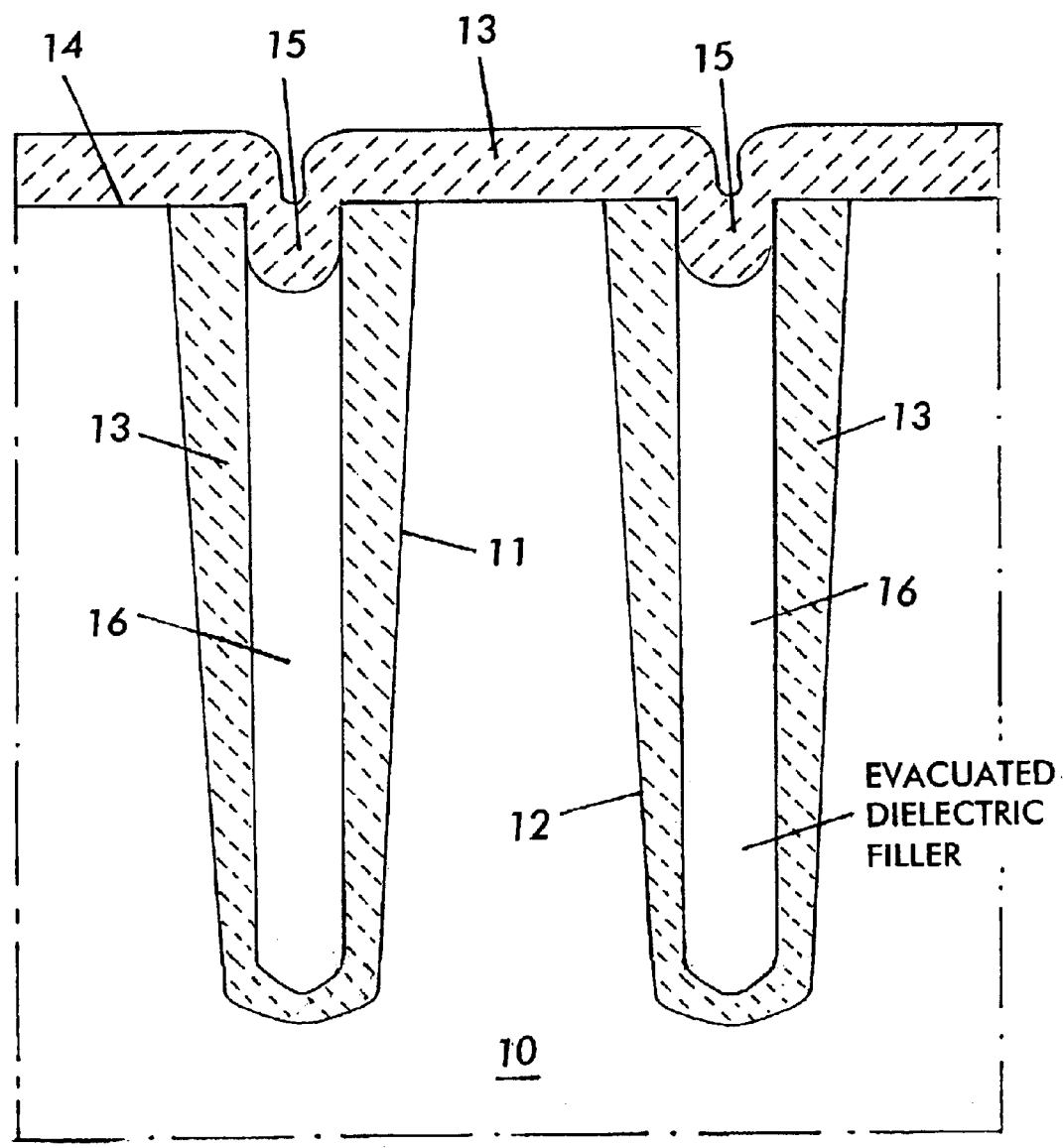
FIG. 1 is a cross-section of a silicon substrate, showing a first embodiment of the invention.

Referring first to FIG. 1, there is shown, in cross-section, a silicon substrate 10, which may be N type and which is to contain a plurality of parallel trenches 11, 12 for any desired purpose, for example, usually to form a superjunction type device. It is necessary to fill the trenches with a dielectric and, when a solid dielectric, such as silicon dioxide is used, it has been hard to uniformly fill the trench interiors which may be about 40 microns deep, but only about 3 microns wide.

In accordance with the invention, an oxide of silicon 13 such as an LTO or PECVD deposited oxide is deposited atop the surface 14 of substrate 10, lining the sides of trenches 13 and forming a sealing cap 15 at the top of each trench.

The interior space 16 of the trenches is at least a partial vacuum, defining the dielectric of the interior space.

In one method of forming the dielectric 13, a first layer of TEOS which is about 7500 Å thick is first deposited, followed by a deposition of $Si_3N_4$ to a thickness of about 1500 Å. The nitride layer prevents the diffusion of phosphorus from a subsequent P doped layer into the silicon walls of the trench. A capping oxide layer to cap the about 3 micron opening of the trenches is formed of a P doped layer of low temperature oxide, which is about 1.5 microns thick, forming a "plug" 15 about 3 microns wide. The oxide layers are then reflowed at 1050° C. in pure oxygen to flush out air, leaving the sealed interior 16 of the trenches evacuated vacuum or partial vacuums. When the trench closes, any remaining $O_2$ will oxidize the silicon walls, and will be consumed.

In another method of the invention, an initial step of depositing 7500 Å of TEOS is followed by a 5 to 90 second overetch step. Thereafter, the steps described above may be carried out.

Figure 2:
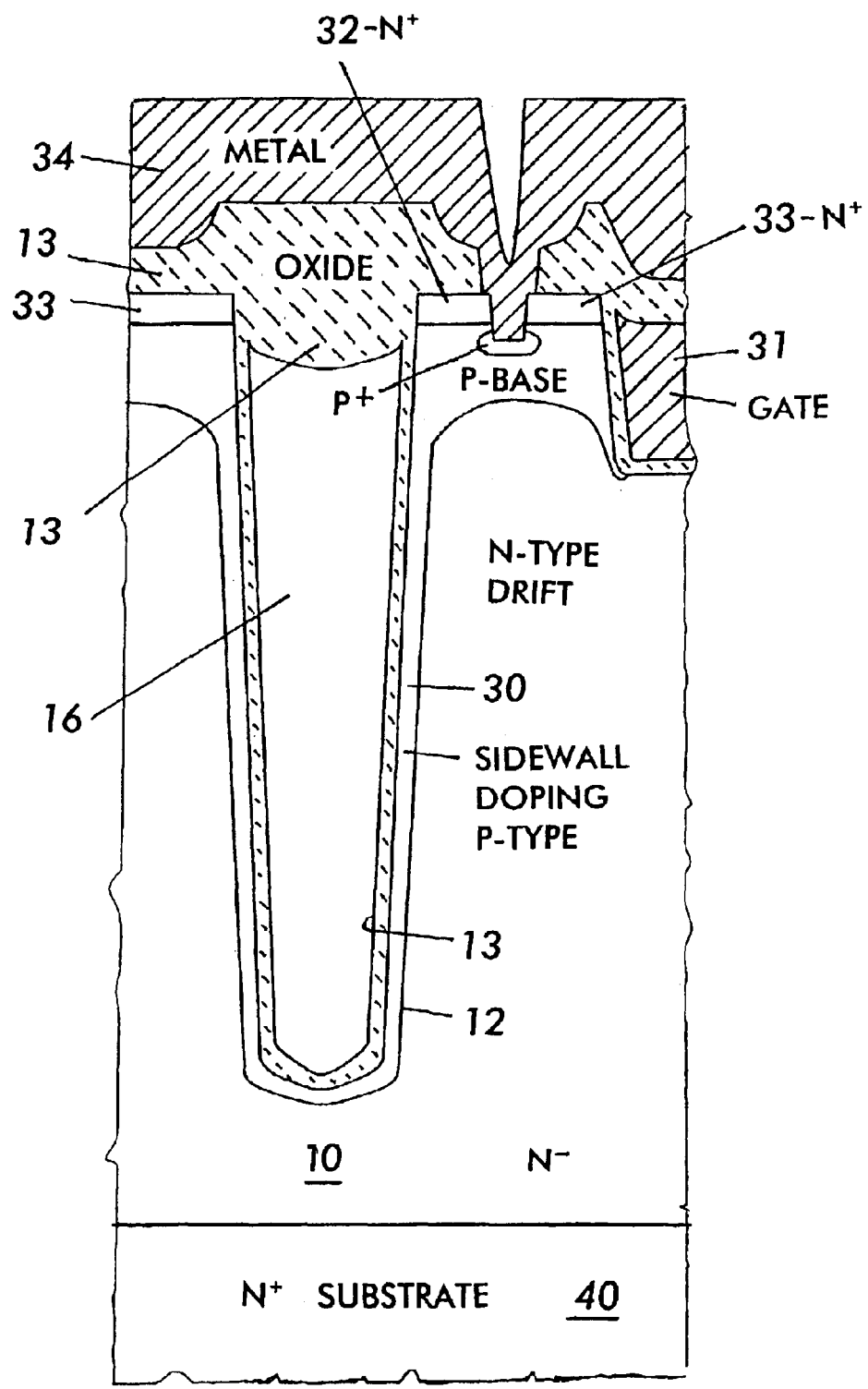
FIG. 2 is a cross-section showing the invention as applied to the trench of a superjunction device.

FIG. 2 is a cross-section like FIG. 1, showing the invention applied to a superjunction geometry. Thus, trench 12 is doped P type (region 30) which has a total charge to balance the total charge of the $N^-$ drift region 10 between trenches. An oxide liner 13 lines the trench and is capped by the oxide cap 15, leaving an evacuated, or partly evacuated volume 16.

FIG. 2 further shows a section like that of FIG. 1, for a superjunction device, using known trench gate 31, $N^+$ source regions 32, 33 and a metal (aluminum) source electrode 34. A further drain electrode (not shown) is connected to the bottom of the $N^+$ substrate 40 which carries the epitaxially deposited $N^-$ layer 10.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor device, comprising:

a silicon substrate, the substrate including:

a top surface;

a first isolation trench having a structure including opposing sidewalls, the sidewalls spaced from each other by a width at the top surface, and the sidewalls extending from the top surface into the substrate to a trench bottom at a depth, the depth being greater than the width and the sidewalls being closed along opposite ends by end surfaces, the end surfaces opposing each other and spaced from each other by a length, the length being greater than the width; and a drift region beside the trench, the drift region having a first conductivity-type, and a portion of the substrate adjacent to the sidewalls being doped with a dopant having a second conductivity-type, the second conductivity-type being of opposite conductivity to the first conductivity-type of the drift region;

a sealing cap, covering the top of the trench such that flow of gas is prevented into or out of a sealed space defined by the sealing cap and the structure of the trench; and the sealed space having a pressure less than atmospheric pressure.

2. The device of claim 1, wherein at least a portion of the sidewalls extending from the top surface are spaced from each other by a width equal to the width at the top surface.

3. The device of claim 2, wherein the depth is at least ten times greater than the width.

4. The device of claim 1, wherein the sealing cap is of an oxide.

5. The device of claim 1, wherein the sidewalls of the trench are lined with a gate oxide.

6. The device of claim 3, wherein the sealing cap is of an oxide.

7. The device of claim 3, wherein the sidewalls of the trench are lined with a gate oxide.

8. The device of claim 1, further comprising a second isolation trench having the structure of the first isolation trench, the second isolation trench having its sidewalls disposed in the same direction as the sidewalls of the first isolation trench, the sealing cap covering both the first isolation trench and the second isolation trench.

9. The device of claim 1, comprising:

a plurality of isolation trenches, each of the plurality of isolation trenches having the structure of the first isolation trench and sidewalls disposed in the same direction as the sidewalls of the first isolation trench, and the sealing cap covering each of the plurality of isolation trenches.

10. The device of claim 9, comprising a plurality of drift regions of an N conductivity-type disposed between adjacent pairs of the plurality of isolation trenches.

11. The device of claim 3, comprising:

a plurality of isolation trenches, each of the plurality of isolation trenches having the structure of the first isolation trench and sidewalls disposed in the same direction as the sidewalls of the first isolation trench, and the sealing cap covering each of the plurality of isolation trenches.

12. The device of claim 5, comprising:

a plurality of isolation trenches, each of the plurality of isolation trenches having the structure of the first isolation trench and sidewalls disposed in the same direction as the sidewalls of the first isolation trench, and the sealing cap covering each of the plurality of isolation trenches.

13. The device of claim 9, wherein the sidewalls of the plurality of isolation trenches are each lined with a silicon dioxide with a layer of $Si_3N_4$ deposited on the silicon dioxide, the layer of $Si_3N_4$ having a thickness such that phosphorus from a subsequent P-doped layer is blocked from diffusing into the sidewalls of the plurality of isolation trenches.

14. The device of claim 9, wherein the sidewalls of the plurality of isolation trenches are lined with a deposited nitride.

15. The device of claim 14, wherein the nitride is of $Si_3N_4$.

16. The device of claim 10, further comprising:

a plurality of trench gate contacts disposed in the plurality of drift regions; and a plurality of source contacts disposed between the plurality of trench gate contacts and the plurality of isolation trenches, such that each of the source contacts is electrically coupled to a P conductivity-type region and the plurality of isolation trenches isolates each of the plurality of trench gate contacts from other of the plurality of trench gate contacts.

* * * * *